United States Patent
Daughton et al.

(10) Patent No.: US 6,963,098 B2
(45) Date of Patent: Nov. 8, 2005

(54) THERMALLY OPERATED SWITCH CONTROL MEMORY CELL

(75) Inventors: James M. Daughton, Eden Prairie, MN (US); Arthur V. Pohm, Ames, IA (US)

(73) Assignee: NVE Corporation, Eden Prairie, MN (US)

(*) Notice: Subject to any disclaimer, the term of this patent is extended or adjusted under 35 U.S.C. 154(b) by 0 days.

(21) Appl. No.: 10/875,082

(22) Filed: Jun. 23, 2004

(65) Prior Publication Data

US 2005/0002267 A1 Jan. 6, 2005

Related U.S. Application Data

(60) Provisional application No. 60/483,371, filed on Jun. 23, 2003.

(51) Int. Cl.[7] ............................................. H01L 31/119
(52) U.S. Cl. ......................... 257/295; 257/311; 438/3; 438/257; 365/158; 365/145
(58) Field of Search ................................ 257/295, 310, 257/311; 438/3, 257; 365/158, 200, 145, 154, 157, 185.07

(56) References Cited

U.S. PATENT DOCUMENTS

| | | | |
|---|---|---|---|
| 4,771,347 A | | 9/1988 | Horimai et al. |
| 4,780,848 A | | 10/1988 | Daughton et al. |
| 4,945,397 A | * | 7/1990 | Schuetz ....................... 257/421 |
| 5,636,159 A | | 6/1997 | Pohm |
| 5,841,692 A | | 11/1998 | Gallagher |
| 5,936,293 A | * | 8/1999 | Parkin ........................ 257/422 |
| 6,385,082 B1 | | 5/2002 | Abraham et al. |
| 6,535,416 B1 | | 3/2003 | Daughton et al. |
| 6,538,919 B1 | | 3/2003 | Abraham et al. |
| 6,674,664 B2 | | 1/2004 | Pohm |
| 6,744,086 B2 | | 6/2004 | Daughton et al. |
| 6,771,534 B2 | | 8/2004 | Stipe |
| 6,777,730 B2 | | 8/2004 | Daughton et al. |
| 2001/0019461 A1 | | 9/2001 | Allenspach et al. |

OTHER PUBLICATIONS

J. Daughton and A. Pohm, "Design of Curie Point Written MRAM Cells". *J. Applied Physics*, 93, No. 10, p. 7304 (2003).

R.S. Beech, J.A. Anderson, A.V. Pohm and J.M. Daughton, "Curie Point Written Magnetoresistive Memory". *J. Applied Physics*, 87, No. 9, pp. 6403–05 (2000).

* cited by examiner

*Primary Examiner*—David Nelms
*Assistant Examiner*—Long Tran
(74) *Attorney, Agent, or Firm*—Kinney & Lange, P.A.

(57) ABSTRACT

A ferromagnetic thin-film based digital memory having a substrate supporting bit structures that are electrically interconnected with information storage and retrieval circuitry and having magnetic material films in which a characteristic magnetic property is substantially maintained below an associated critical temperature above which such magnetic property is not maintained separated by at least one layer of a nonmagnetic material with each bit structure having an interconnection structure providing electrical contact thereto at a contact surface thereof substantially parallel to the intermediate layer positioned between the first contact surface and the substrate. A plurality of word line structures located across from a corresponding one of the bit structures on an opposite side of the intermediate layer of a corresponding one of said bit structures from its interconnection structure provides electrical contact thereto. Sufficient electrical current selectively drawn through each of these bit structures and its interconnection structure can cause substantial heating of that bit structure to raise temperatures thereof to have at least one of the magnetic material films therein at least approach its corresponding associated critical temperature while being substantially above temperatures of at least an adjacent said bit structure because of sufficient thermal isolation.

22 Claims, 7 Drawing Sheets

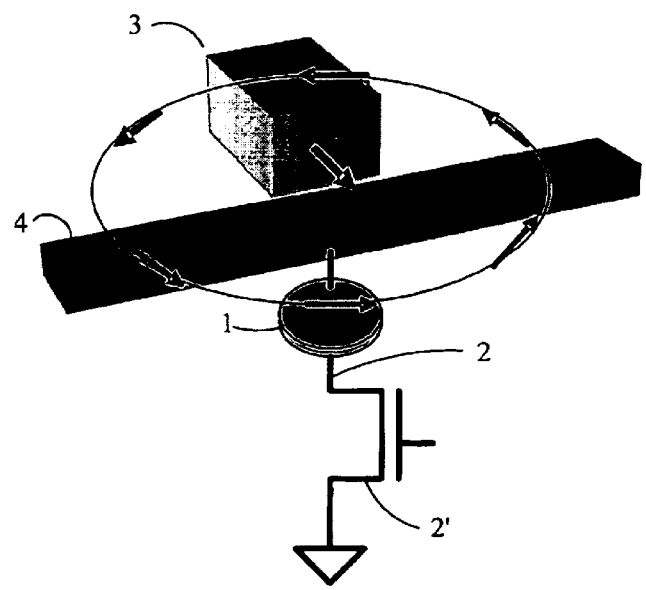
FIG. 2
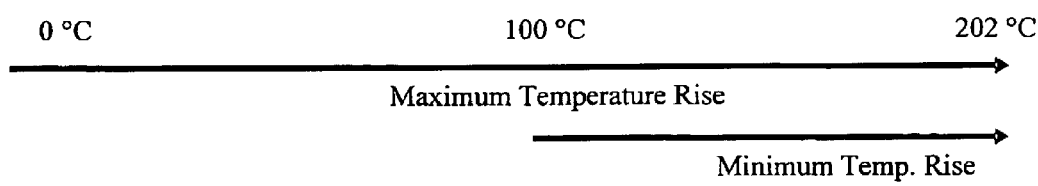
FIG. 3

THERMALLY OPERATED SWITCH CONTROL MEMORY CELL

CROSS-REFERENCE TO RELATED APPLICATION(S)

This application claims the benefit of Provisional Application No. 60/483,371 filed on Jun. 23, 2003 for "THERMALLY OPERATED SWITCH CONTROL MEMORY CELL".

BACKGROUND OF THE INVENTION

The present invention relates to ferromagnetic thin-film structures exhibiting relatively large magnetoresistive characteristics and, more particularly, to such structures used for the storage and retrieval of digital data.

Many kinds of electronic systems make use of magnetic devices including both digital systems, such as memories, and analog systems such as magnetic field sensors. Digital data memories are used extensively in digital systems of many kinds including computers and computer systems components, and digital signal processing systems. Such memories can be advantageously based on the storage of digital symbols as alternative states of magnetization in magnetic materials provided in each memory storage cell, the result being memories which use less electrical power and do not lose information upon removals of such electrical power.

Such memory cells, and magnetic field sensors also, can often be advantageously fabricated using ferromagnetic thin-film materials, and are often based on magnetoresistive sensing of magnetic states, or magnetic conditions, therein. Such devices may be provided on a surface of a monolithic integrated circuit to provide convenient electrical interconnections between the device and the operating circuitry therefor.

Ferromagnetic thin-film memory cells, for instance, can be made very small and packed very closely together to achieve a significant density of information storage, particularly when so provided on the surface of a monolithic integrated circuit. In this situation, the magnetic environment can become quite complex with fields in any one memory cell affecting the film portions in neighboring memory cells. Also, small ferromagnetic film portions in a memory cell can lead to substantial demagnetization fields which can cause instabilities in the magnetization state desired in such a cell.

These magnetic effects between neighbors in an array of closely packed ferromagnetic thin-film memory cells can be ameliorated to a considerable extent by providing a memory cell based on an intermediate separating material having two major surfaces on each of which an anisotropic ferromagnetic memory thin-film is provided. Such an arrangement provides significant "flux closure," i.e. a more closely confined magnetic flux path, to thereby confine the magnetic field arising in the cell to affecting primarily just that cell. This result is considerably enhanced by choosing the separating material in the ferromagnetic thin-film memory cells to each be sufficiently thin.

Operating magnetic fields imposed externally can be used to vary the angle of the magnetization vector in such a film with respect to the easy axis of that film. Such an axis comes about in the film because of an anisotropy therein typically resulting from depositing the film during fabrication in the presence of an external magnetic field oriented in the plane of the film along the direction desired for the easy axis in the resulting film, or by the shape of the film favoring the magnetization thereof to lie along a preferred direction, or both. During subsequent operation of devices having this resulting film, such operational magnetic fields imposed externally can be used to vary the angle to such an extent as to cause switching of the film magnetization vector between two stable states which occur for the magnetization being oriented in opposite directions along the film's easy axis. The state of the magnetization vector in such a film can be measured, or sensed, by the change in resistance encountered by current directed through this film portion. This arrangement has provided the basis for a ferromagnetic, magnetoresistive anisotropic thin-film to serve as a memory cell.

In the recent past, reducing the thicknesses of the ferromagnetic thin-films and the intermediate layers in extended "sandwich" structures, and adding possibly alternating ones of such films and layers, i.e. superlattices, have been shown to lead to a "giant magnetoresistive effect" being present in some circumstances. This effect yields a magnetoresistive response which can be in the range of up to an order of magnitude or more greater than that due to the well known anisotropic magnetoresistive response.

The giant magnetoresistive effect involves a change in the electrical resistance of the structure thought to come about from the passage of conduction electrons between the ferromagnetic layers in the "sandwich" structure, or superlattice structure, through the separating nonmagnetic layers with the resulting scattering occurring at the layer interfaces, and in the ferromagnetic layers, being dependent on the electron spins. The magnetization dependant component of the resistance in connection with this effect varies as the sine of the absolute value of half the angle between the magnetization vectors in the ferromagnetic thin-films provided on either side of an intermediate nonmagnetic layer. The electrical resistance in the giant magnetoresistance effect through the "sandwich" or superlattice structure is lower if the magnetizations in the separated ferromagnetic thin-films are parallel and oriented in the same direction than it is if these magnetizations are antiparallel, i.e. oriented in opposing or partially opposing directions.

A memory cell based on the "giant magnetoresistive effect" can be provided by having one of the ferromagnetic layers in the "sandwich" construction being prevented from switching the magnetization direction therein from pointing along the easy axis therein in one to the opposite direction in the presence of suitable externally applied magnetic fields while permitting the remaining ferromagnetic layer to be free to do so in the same externally applied fields. In one such arrangement, a "spin-valve" structure is formed by providing an antiferromagnetic layer on the ferromagnetic layer that is to be prevented from switching in the externally applied fields to "pin" its magnetization direction in a selected direction. In an alternative arrangement often termed a "pseudo-spin valve" structure, the ferromagnetic layer that is to be prevented from switching in the externally applied fields is made sufficiently thicker than the free ferromagnetic layer so that it does not switch in those external fields provided to switch the free layer.

Thus, a digital data memory cell based on the use of structures exhibiting the giant magnetoresistive effect is attractive as compared to structures based on use of an anisotropic magnetoresistive effect because of the larger signals obtainable in information retrieval operations with respect to such cells. Such larger magnitude signals are easier to detect without error in the presence of noise thereby leading to less critical requirements on the retrieval operation circuitry.

An alternative digital data bit storage and retrieval memory cell suited for fabrication with submicron dimensions can be fabricated that provides rapid retrievals of bit data stored therein and low power dissipation memory through use of a cell structure that has a spin dependent tunneling junction (SDTJ), or magnetoresistive tunnel junction (MTJ), device therein based on a pair of ferromagnetic thin-film layers having an electrical insulator layer therebetween of sufficient thinness to allow tunneling currents therethrough. This memory cell can be fabricated using ferromagnetic thin-film materials of similar or different kinds in each of the magnetic memory films present in such a "sandwich" structure on either side of an intermediate nonmagnetic layer where such ferromagnetic films maybe composite films, but this intermediate nonmagnetic layer conducts electrical current therethrough based primarily on the quantum electrodynamic effect "tunneling" current mentioned above.

This "tunneling" current has a magnitude dependence on the angle between the magnetization vectors in each of the ferromagnetic layers on either side of the intermediate layer due to the transmission barrier provided by this intermediate layer depending on the degree of matching of the spin polarizations of the electrons tunneling therethrough with the spin polarizations of the conduction electrons in the ferromagnetic layers, the latter being set by the layer magnetization directions to provide a "magnetic valve effect". Such an effect results in an effective resistance or conductance characterizing this intermediate layer with respect to the "tunneling" current therethrough. In addition, an antiferromagnetic layer against one of the ferromagnetic layers is used in such a cell to provide different magnetization switching thresholds between that ferromagnetic layer and the other by fixing, or "pinning", the magnetization direction for the adjacent ferromagnetic layer while leaving the other free to respond to externally applied, fields. Such devices maybe provided on a surface of a monolithic integrated circuit to thereby allow providing convenient electrical connections between each such memory cell device and the operating circuitry therefor.

A "sandwich" structure for such a memory cell, based on having an intermediate thin layer of a nonmagnetic, dielectric separating material with two major surfaces on each of which a anisotropic ferromagnetic thin-film is positioned, exhibits the "magnetic valve effect" if the materials for the ferromagnetic thin-films and the intermediate layers are properly selected and have sufficiently small thicknesses. The resulting "magnetic valve effect" can yield a response which can be several times in magnitude greater than that due to the "giant magnetoresistive effect" in a similar sized cell structure.

As stated above, operating magnetic fields imposed externally can be used to vary the angle of the magnetization vector with respect to the easy axis in the ferromagnetic films of these various kinds of memory cell devices, particularly the free layers. Such operational magnetic fields imposed externally can be used to vary the angle to such an extent as to cause switching of the layer magnetization vector between two stable states which occur for the magnetization being oriented in opposite directions along the easy axis of the layer, the state of the cell determining the value of the binary bit being stored therein. One of the difficulties in such memories is the need to provide memory cells therein that have extremely uniform switching thresholds and adequate resistance to unavoidable interjected magnetic field disturbances in the typical memory cell state selection scheme used. This externally applied operating fields scheme is based on selective externally imposed magnetic fields provided by selectively directing electrical currents over or through sequences of such cells thereby giving rise to such magnetic fields so that selection of a cell occurs through coincident presences of such fields at that cell.

In such a coincident current selection arrangement, only that cell in the vicinity of the crossing location, or intersection, of these two paths (one over a sequence of cells and the other through another sequence of cells) experience sufficient magnetic field intensities due to the summing of the fields due to these two currents to cause such a magnetic state change therein. Cells in the array that are located far away from both of these two current paths are not significantly affected by the magnetic fields generated by such currents in the paths because such fields diminish in intensity with distance from the source thereof. Cells, however, located in relatively close proximity to one, but not two, of these two paths do experience more significant magnetic fields thereabout, and those immediately in or adjacent to one such path experience sufficient field intensities to be considered as being "half-selected" by the presence of current in that path intended to participate in fully selecting a different cell along that path at the intersection with the other path on which a selection current is present. Half-selection means that a bit is affected by magnetic fields from the current through one path but not another. Such a coincident interjected magnetic fields memory cell state selection scheme is very desirable in that an individual switch, such as that provided by a transistor, is not needed for every memory cell, but the limitations this selection mode imposes on the uniformity of switching thresholds for each memory cell in a memory make the production of high yields difficult.

As such magnetic thin-film memory cells are made smaller to thereby increase the cell density over the surface of the substrate on which they are disposed, the resulting cells become more subject to magnetic state, or data, upsets due to thermal fluctuations occurring in the materials therein. The depth of the energy well in the magnetic material of such cells can be approximated as $H_{weff}*M_s*$Volume, where $H_{weff}$ is half the effective restoration magnetic field attempting to maintain the current magnetic state following perturbations thereto and so effectively providing the energy well depth, $M_s$ is the saturation magnetization of the magnetic material in the cell, and Volume is the volume of the magnetic material in the cell. In conventional cells, $H_{weff}$ is provided by shape anisotropy or anisotropy due to the material properties of the cell magnetic material, or both. Typically, the value of $H_{weff}$ in these cells is less than 100 Oe.

The important factor is the smallest energy well depth for a half-selected cell. The design objective is to ensure that the memory cells are magnetically stable during the data storing, or magnetic state switching, procedure that is repeatedly undertaken with respect to other cells. However, the trade-off between thermal stability and magnetic stability is a serious problem when the total magnetic volume of bits is less than about $10^4$ to $10^5$ nm$^3$. Although the required barrier energy to be thermally stable can be reduced by use of error correction and periodic retrievals with corresponding corrections of the data stored in the whole memory, such a memory takes additional chip area and increased processing steps thereby increasing costs and reducing operating rapidity.

Meeting the thermal stability requirement of maintaining the same energy well depth for thermal stability in scaled own area memory cells necessitates the thickness of the resulting free layer being increased. Then the total anisotropy field correspondingly increases and so the required sense line current through the cell increases and the required word line current adjacent the cell increases to be capable of switching the magnetization direction of the free layer. This in turn causes the current density in the sense line to increase and temperature to rise in the line. These results show the very dramatic increase in current density as cells are reduced in width so that electromigration in the current conductors along with heating must be considered.

As indicated above, a ferromagnetic layer and an antiferromagnetic layer can be deposited in succession so they are in contact with one another with the result that relatively large interatomic forces occur aligning electron spins (parallel for ferromagnetism and antiparallel for antiferromagnetism). These coupling forces at the interface between these layers can be such that the magnetization of the ferromagnetic layer is restored to its initial direction prior to being subjected to external magnetic fields even after very large external magnetic fields are subsequently applied thereto. Such external magnetic fields can be 1000 Oe or more, and the magnetization of the ferromagnetic layer will still be restored to its initial direction. Thus, if such an antiferromagnetic layer is provided in contact with a ferromagnetic layer in a memory cell so that relatively large coupling occurs therebetween, the energy well depth for a small memory cell can be greatly increased. Such an arrangement can increase the potential density of memory cells by more than a factor of 10 through permitting the cell dimensions to go from about 0.2 µm minimum dimensions to approximately 0.05 µm dimensions.

A film structure which exhibits even better resistance to the effects of large externally applied magnetic fields is provided by a compound ferromagnetic thin-film layer with an antiferromagnetic layer. This compound ferromagnetic thin-film layer is provided to have a net layer magnetization that, when fixed in orientation in the finally formed structure, will resist rotation of its magnetization so that the magnetization of this compound ferromagnetic thin-film layer will appear fixed in its orientation in the device, i.e. "pinned" in a direction relative to the finally formed structure.

This compound ferromagnetic thin-film layer is formed by depositing a ferromagnetic layer in the presence of an easy axis direction determination magnetic field, then a nonmagnetic layer of ruthenium (no orienting magnetic field needed in this instance) to provide a very thin ruthenium antiferromagnetic coupling layer. Thereafter, another ferromagnetic layer is deposited again in the presence of an easy axis direction determination magnetic field aligned as was the field for the first ferromagnetic layer. The resulting compound ferromagnetic layer has materials with high spin polarization in its outer layers due to the use of high magnetic induction ferromagnetic material therein, but has little net magnetic moment because of the ruthenium layer provided therebetween which strongly antiferromagnetically couples these outer layers through primarily exchange coupling (some magnetostatic coupling also present)so that the magnetizations of each are pointed in opposite directions. Thus, this layer is relatively insensitive to externally applied fields and contributes little to the spatial fields thereabout. However, the magnetization direction in this composite layer by itself is not very strongly fixed in any direction because of the relatively weak anisotropy exhibited by the ferromagnetic layers.

Thus, a further antiferromagnetic material "pinning" layer exhibiting a substantial magnetic anisotropy must be deposited on the last ferromagnetic layer in the presence of a magnetization axis determination magnetic field aligned with the fields used in forming the two ferromagnetic layers to strongly set the magnetization direction of the compound layer. Such an antiferromagnetic layer has a strongly fixed magnetization direction which, through exchange coupling to the last ferromagnetic layer on which it is deposited, strongly fixes the direction of magnetization of that layer also, and so that of the first ferromagnetic layer through the ruthenium layer. The result is an anti ferromagnetic layer coupled strongly to the compound layer together forming a "synthetic anti ferromagnet".

The magnetic fields necessary to reach the layer switching thresholds to cause switching of the relatively fixed magnetization orientation layers magnetization directions for memory cells of smaller and smaller lengths and widths to thereby change the data stored therein have, of course, magnitudes beyond those of the fields required to switch the magnetization directions in the free layers of those cells which also increase for smaller cells as shown above. Generating such magnetic fields begins to require currents through such cells and associated word lines of magnitudes that result in current densities sufficient to cause significant electromigration of the conductive materials and operating temperature rises of the cell region which will alter device behavior and structure. Such effects thereby lead to a limit of some minimum size for these cells.

One possibility for avoiding such limits has been found through allowing memory cell device operating temperature increases due to heating because of supplying word line currents adjacent to, and sense currents in, memory cells sufficient to approach or exceed the Curie temperature of the ferromagnetic layers in memory cells without a "pinning" layer or layers therein, or to approach or exceed the blocking temperature of the antiferromagnetic "pinning" layer in cells having such a layer. Such word line and sense line current based temperature increases permit storage of information in those cells to be achieved without reaching current magnitudes otherwise necessary to switch the magnetization directions of the ferromagnetic layers. The direction of magnetization of the relatively fixed magnetization orientation layer such as the thicker ferromagnetic layer in a three layer "sandwich" structure can be selected by having a moderate magnetic field present oriented in the selected direction when the layer cools sufficiently below its Curie temperature for cells without a "pinning" layer present, or by a field sufficient to set the direction of the ferromagnetic layer adjacent an antiferromagnetic "pinning" layer when that "pinning" layer cools sufficiently below its blocking temperature for cells using such a "pinning" layer or, alternatively, a "pinning" layer composite. The blocking temperature of an antiferromagnetic layer is the temperature at or above which that layer loses its ability to "pin" the magnetization direction of an adjacent ferromagnetic layer below its Curie temperature which blocking temperature is usually less than the Nèel temperature of that layer. Similarly, the Curie temperature may not need to be fully reached to allow relatively easy reorienting of the magnetization direction therein.

FIG. 1 is a graph of a ferromagnetic material layer magnetization normalized by the layer saturation magnetization versus temperature normalized by the layer Curie temperature indicating the nature of Curie point based data storage. Magnetization as a function of temperature changes rapidly near the layer Curie point. If 0 to 100° C. is the ambient temperature range of the silicon chip supporting this layer, then self-heating currents would raise the temperature of the cell to the Curie point, approximately 200° C. The currents would track the silicon substrate temperature, i.e. there would be more current required if the substrate were 0° C. than if the substrate were at 100° C.

A similar scheme would apply if pinning through providing an antiferromagnetic layer were used instead, and the critical temperature would then be the Nèel temperature of the antiferromagnet. In an antiferromagnet, the ordering of magnetic moments of adjacent atoms are in opposite directions so that the net magnetic moment is zero or near zero. When an antiferromagnetic layer and a ferromagnetic layer are sputtered as sequential layers, the antiferromagnetic layer as indicated above can effectively pin the magnetization of the ferromagnetic layer with an effective field of thousands of Oersteds. This pinning field is used in the case of Nèel point data storage to provide the stability of the cell. As the cell is cooled to below the Nèel temperature, a small magnetic field should be adequate to write the cell into the desired memory state.

Reducing the magnitudes of currents necessary for causing the magnetically harder ferromagnetic layer in memory cells with or without a "pinning" layer to approach or reach its Curie temperature, or the antiferromagnetic layer in memory cells with a "pinning" layer arrangement to approach or reach its blocking temperature, and insulating such memory cells from their neighboring cells to provide good cell selectivity in storing information, requires providing some thermal isolation of each cell from its neighbors and from the integrated circuit substrate or any other kind of substrate serving as a heat sink. Such thermal isolation can be provided by use of electrical conductive interconnections that are of a relatively low thermal conductivity, and by supporting the memory cell on an electrical insulator of relatively low thermal conductivity.

As stated above, operating magnetic fields imposed externally by providing electric currents through the sense line in which a cell is connected, and through the word line adjacent to the cell, can be used to vary the angle of the magnetization vector with respect to the easy axis in the ferromagnetic films of these various kinds of memory cell devices. The various magnetoresistive memory cell types thus use a coincident interjected magnetic fields memory cell state selection scheme for retrieving stored data. Such magnetic selection schemes for data retrievals introduce further data disturbance opportunities through again generating magnetic fields that can combine with unwanted magnetic fields that appear.

Electrical currents along the same conductors, but of increased magnitude, can also be used to heat the cell to provide for either Curie point or Nèel point data storage. In operation, each cell, when not to be selected for a state imposition therein, has no currents in the pair of sense line and word line conductors crossing in or adjacent to them or has current in only one of that pair. A selected cell, on the other hand, coincidently receives both of the corresponding currents along the two perpendicular sense and word lines crossing in or by it and is thereby heated into the desired condition to set a selected memory state by therein by magnetic fields generated by one of these currents kept though reduced following the heating. However, this arrangement dissipates heat along the entire sense line and along the entire word line carrying these currents to thereby result in substantial power dissipation and heating of otherwise unselected cells. Thus, there is a desire for a memory cell configuration and corresponding memory cell selection arrangement that allows providing magnetoresistive based memories that are less dissipative but still having the memory cells therein provided with a large areal density.

BRIEF SUMMARY OF THE INVENTION

The present invention provides a ferromagnetic thin-film based digital memory having a substrate supporting bit structures separated from one another by spacer material that are electrically interconnected with information storage and retrieval circuitry and having magnetic material films in which a characteristic magnetic property is substantially maintained below an associated critical temperature above which such magnetic property is not maintained of which two are separated by at least one layer of a nonmagnetic material having two major surfaces on opposite sides thereof with these bit structures each having an interconnection structure providing electrical contact thereto positioned against a contact surface thereof substantially parallel to the intermediate layer major surfaces and also being between the contact surface and the substrate. There is also a plurality of word line structures each located across from a corresponding one of the bit structures on an opposite side of the intermediate layer of a corresponding one of said bit structures from the first interconnection structure providing electrical contact thereto. The information storage and retrieval circuitry can draw a sufficient electrical current selectively through each of these bit structures and its interconnection structure providing electrical contact thereto to cause substantial heating of that bit structure to raise temperatures thereof to have at least one of the magnetic material films therein at least approach its corresponding associated critical temperature while being substantially above temperatures of at least an adjacent said bit structure because of sufficient extent of, and smallness of thermal conductivities of, at least portions of the selected bit structure and of those portions of the substrate and the spacer material positioned thereabout.

Low thermal diffusivity material can be used to couple the magnetic material films to the interconnection structure, and such a layer can also be provided on an opposite side of the intermediate layer to couple the magnetic material films to another interconnection structure or to the corresponding word line. In the latter arrangement, magnetic material cladding of the word line can be extended to magnetically shield the bit structure formed in conjunction with the intermediate layer therein.

BRIEF DESCRIPTION OF THE DRAWINGS

FIG. 2 shows a schematic perspective view of a magnetoresistive memory cell arrangement, FIG. 3 shows a temperature operating range diagram.

DETAILED DESCRIPTION

Figure 1:
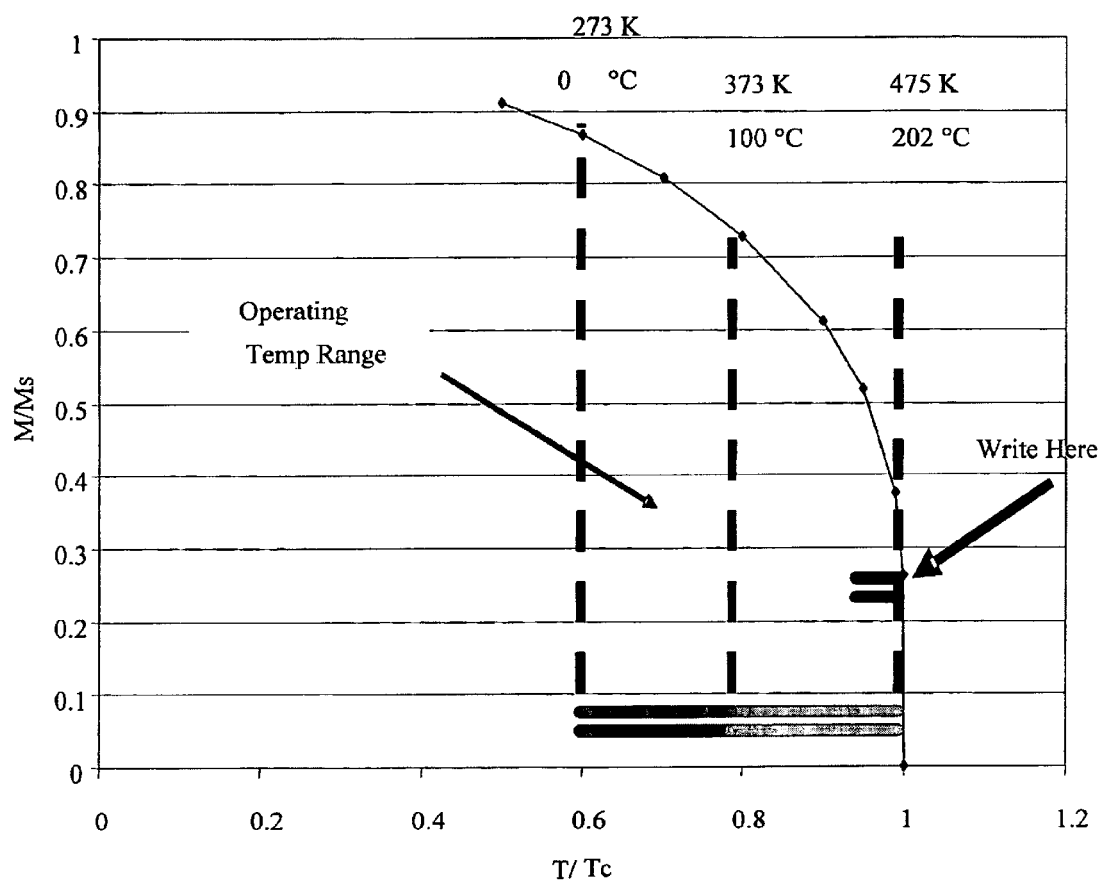
FIG. 1 shows graph with a plot of ferromagnetic material layer magnetization versus normalized temperature.

FIG. 2 shows a schematic representation of a memory cell arrangement that uses a combination of heat and magnetic fields to store data in a cell structure, 1. This device is part of a two dimensional area based array of such cells, typically formed on a substrate, 2, containing a monolithic integrated circuit including switching transistors such as a MOSFET, 2', in which a selected cell 1 is at the intersection of (a) one of many word line conductors, 3, in being adjacent thereto, which conductor provides magnetic fields by the current supplied therethrough but little heat, and of (b) a current supply line, 4, connected to cell structure 1 that structure further, in turn, being connected the corresponding cell selection switching transistor 2' having a source or drain thereof connected to cell structure 1. Transistor 2' is switched into an "on" condition by applying suitable electrical potentials to supply line 4 and to the gate thereof with the remaining one of the transistor source or drain typically being connected to the ground circuit voltage reference.

The resulting current drawn through the "on" condition transistor and the cell structure provides resistance based heat generation in cell structure 1, which makes the magnetizations of the magnetic material layers in that cell structure more easily switched in direction which, after switching, can be in either direction along some reference axis depending on the value of the data bit so stored therein. The polarity of the current through first conductor 3 determines the magnetic state of the cell, i.e. the one of the two directions along the reference axis in cell structure 1 and so whether the cell stores a binary "one" state or a binary "zero" state. The current to heat cell structure 1 should be as small as possible so as to minimize the size of selection transistor 2' to thereby minimize the area taken by the memory cell on the substrate surface to thereby provide the maxim surface density of such cells.

In the diagram in FIG. 3, an operating range of 0 to 100° C. is shown as an example. A Curie point (or Nèel point) of 202° C. is also assumed. If a memory chip can be at any temperature when a cell data storage operation is initiated, then the heating current must raise the temperature of the cell in which data is to be stored by 202° C. If the same current would be used when the initial temperature is 100° C., then the cell temperature would rise to about 302° C. This may not be desirable due to reliability concerns, and so a current source is used which provides a current which tracks the temperature of the memory chip substrate to thereby regulate the heating current to substantially just attain the desired critical temperature (Nèel or Curie point). In this example, the minimum heating current would be about 71% of the maximum heating current.

The same current path is to be used for sensing the state of the cell, i.e. to retrieve the stored data therefrom. The sensing (or retrieval) current must be small enough to insure that the memory cell is not thermally upset thereby. Because the power dissipated (and thermal rise) is proportional to the square of the current, a data retrieval current of ⅓ or ¼ of the minimum thermal data storage current will give a thermal rise of ⅑ to ¹⁄₁₆ of the thermal rise which is caused by the minimum thermal data storage current.

Regardless of the actual cell structure chosen for cell structure 1 in the memory cells arrangement, the cells must both heat and cool quickly for the arrangement to operate rapidly in changing the data stored therein. Nevertheless, minimizing the magnitudes of the data storage currents is important as stated above. The cell structures are connected to current conductors 4 and the substrate interconnection metallization which are formed of metals typically used in monolithic integrated circuits to thereby result in having both high electrical and thermal conductivities that serve as heat sinks. Thus, each cell structure I should be connected to these metals through interconnection leads (taken here to be of length L) having good electrical conductivity but relatively low thermal conductivity to thereby allow heat to accumulate in the cell structure to sufficiently raise the temperature thereof. A schematic layer diagram view of such a cell structure interconnection arrangement is shown in FIG. 4 where conductor 4 is connected to cell structure 1 by an intermediate lead 4', and where the substrate interconnection metallization in substrate 2 is connected to cell structure 1 by intermediate lead 2".

Figure 4:
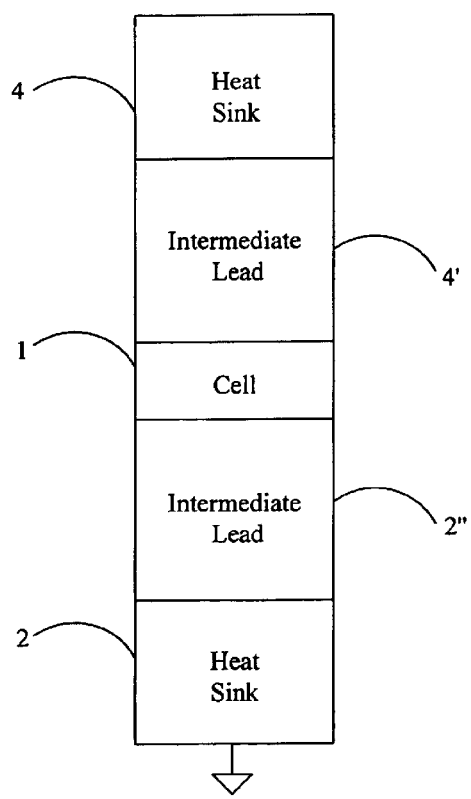
FIG. 4 shows a schematic layer diagram of a cell structure interconnection arrangement.

For efficient use of the heating current, most of the heating due to electrical current path resistance based power dissipation ($I^2R$) should occur in cell structure 1. Solutions to the heat equation for linear heat flow show that the thermal rise $\Delta T$ from the heat sinks is approximated by $$\Delta T = PL/2KA,$$

where P is the power dissipated in the cell structure region, L is the length of each intermediate lead, K is the thermal conductivity of each intermediate lead, and A, perpendicular to L, is the cross-sectional area of the vertically shown heat path in FIG. 4. Similarly, the time constant τ for heating or cooling through the lead is approximated by $$\tau = L^2/2D,$$

where D is the thermal diffusivity of each intermediate lead. The intermediate leads material must be chosen to allow fast heating and cooling of cell structure 1 and permit the required thermal rise of cell structure 1 at low power. In addition, the electrical resistance of the intermediate leads should be significantly less than the electrical resistance of cell structure I to get the maximum retrieved signal out of cell structure 1. The electrical resistance of the intermediate leads is approximated by $$R = 2\rho L/A,$$

where ρ is the electrical resistivity of the material.

There are many cell structure alternatives useable for cell structure 1 operated in the environment and manner described above with cell structure choices being primarily made on the basis of minimizing the area taken up thereby over the substrate supporting it. These alternatives include a Curie temperature point double tunnel junction and a Nèel temperature point modified vertical spin valve to be described below. A minimum size transistor provided in the substrate is assumed available to be able to draw a 100 mA current through the cell structure. Such a value of current can be obtained even as MOSFET transistors are scaled from 0.2 μm to 0.1 μm to 0.05 μm feature size lithographies.

One of the primary advantages of spin dependent tunneling devices or, magnetic tunnel junctions, is their having high magnetoresistance changes with different magnetization direction combinations of the magnetizations of the magnetic material layers in such devices. The junctions are sensitive to the voltage maintained across them, and at higher temperatures, a junction bias of 200 mV may be the approximate limit for reliable operation. This suggests a heating power of (0.2V×0.1 mA) or 20 mW if a single tunnel junction is used. More heating can be achieved if two tunnel junctions are stacked one atop another as shown in the layer diagram schematic representation thereof in FIG. 5 for use as cell structure 1.

Figure 5:
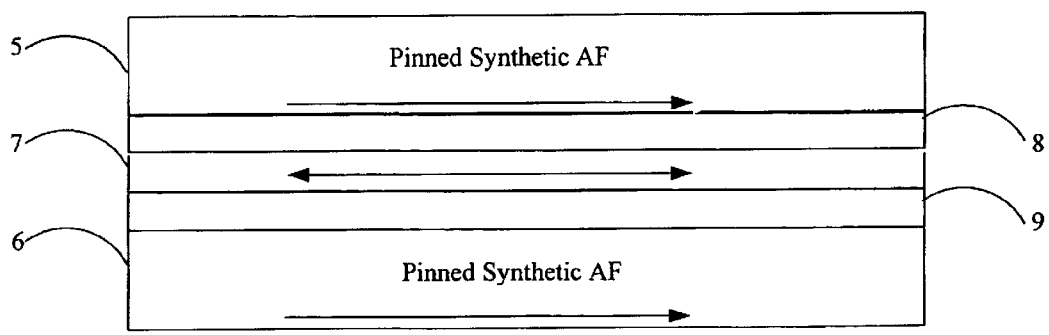
FIG. 5 shows a schematic layer diagram of a cell structure arrangement.

The pinned synthetic antiferromagnets, 5 and 6, are each two magnetic layers "sandwiching" a thin ruthenium layer (providing strong antiparallel coupling between the magnetic layers) with the magnetic layers further from the tunnel junctions in each such "sandwich" being "pinned" by being in intimate contact with an antiferromagnetic film as described above. In FIG. 5, the magnetization direction of each of pinned synthetic antiferromagnets 5 and 6 are shown to be in a common direction which is to the right in that figure. The device has two stable magnetic states set by the magnetization direction of a "free layer', 7, pointing either to the left or to the right as is set in the data storage operation provided between the two tunnel junction barriers, 8 and 9. The device magnetoresistance, the electrical resistance therethrough from one of antiferromagnets 5 and 6 to the other, is higher if the magnetization of free layer 7 points to the left opposite to the magnetization directions of pinned synthetic antiferromagnets 5 and 6, and lower if it instead points to the right in parallel therewith. A typical free layer would be formed of 30 Å of NiFe with an 80/20 composition perhaps doped with boron to set the Curie point temperature and the magnetic layers in the synthetic antiferromagnets would also typically be 30 Å thick of CoFe with a 90/10 composition "sandwiching" between them a 9 Å layer of ruthenium. The antiferromagnetic pinning layers would typically be 200 Å of PtMn.

Note that, if the current drawn through such a cell structure is 100 $\mu$A and the voltage across one of the junction barriers therein is 200 mV, then the tunneling resistance of the junction will be 2000 $\Omega$. If the device area is 0.5(0.1×0.1 $\mu$m$^2$) or 0.005 $\mu$m$^2$, then the resistance-area product of the junction would be 10 W–$\mu$m$^2$. This is a value of resistance-area product which is readily achievable.

If the data retrieval current is ⅓ of the minimum data storage current, and if the minimum data storage current is 70% of the maximum data storage current (where the voltage across the junctions is 200 mV/junction), then the sense signal would (200 mV)(0.7/3)(TMR) where TMR is the "tunneling magnetoresistance" or maximum electrical resistance change across a magnetic tunnel junction. The TMR for 10 W–mm$^2$ junctions is typically about 20%. This would lead to a sense signal of about 9 mV, which is quite satisfactory for a moderately fast (~50 ns data retrieval access time) memory.

Figure 6:
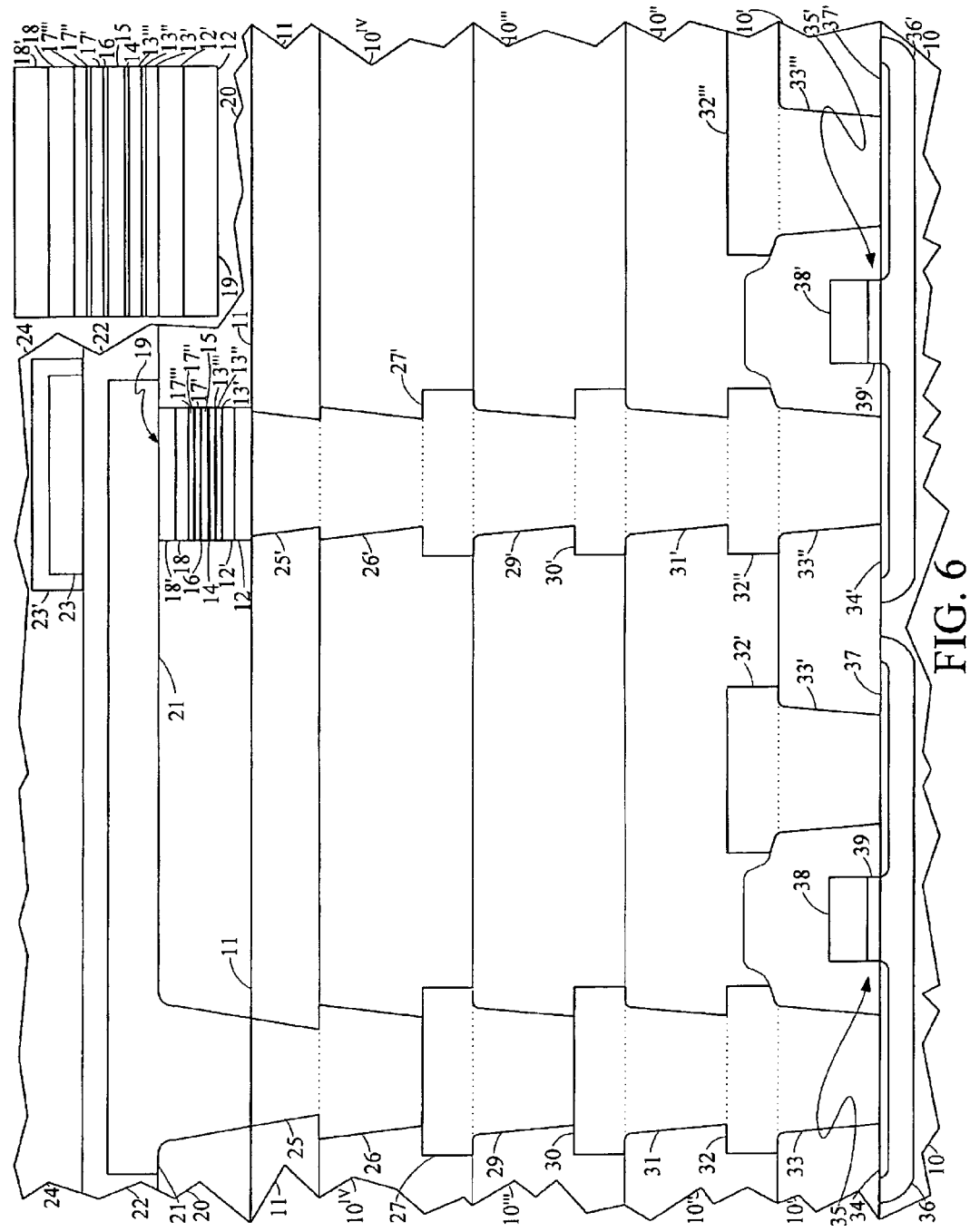
FIG. 6 shows a layer diagram of a cell structure and interconnection arrangement in a monolithic integrated circuit cell control configuration.

FIG. 6 illustrates a layer diagram view of a representation of a stacked double tunnel junction cell in more detail than is shown in the schematic layer diagram of FIG. 5 in being shown in a representative monolithic integrated circuit implementation. In this FIG. 6, the current path through the cell structure is provided again by a separate current supply line like supply line 4 in FIG. 2 and so is not common to the word line conductor which again is separate as is word line conductor 3 in FIG. 2. Thus, heating of the cell in FIG. 6 is accomplished through establishing current in the supply line thereto as in cell structure 1 of FIG. 2, and so the word line conductor not needing to carry significant current for heating can be a relatively long line (crossing several thousand cells). For a low electrical resistance in this line, the primary electrical conductor therein can be of relatively thick (~25 $\mu$m) copper or aluminum. Obtaining higher magnetic fields for the currents established therein is promoted by cladding the word line conductor, i.e. the sides and top of the primary electrical conductor forming the word should be clad with a high magnetic permeability material such as permalloy, as is shown in this figure and described below.

The shape of the cell structure can be rectangular or elliptical with respect to the free layer major surfaces so as to give it shape anisotropy to thereby set the possible magnetization directions to be available therein from which one is to be selected as the cell cools following its having been heated to the appropriate critical temperature. The eccentricity of the elliptical shape determines the stability of the cell at normal operating temperatures.

For a Curie point of about 200° C., a cobalt iron alloy doped with boron is a good choice for free layer 6. Amorphous alloys with those materials have Curie points of about that temperature. Tunneling devices with high TMR have made from both CoFeB and CoFeHfO so that the CoFeB sputtered alloy is a good choice for free layer 6.

The other alternative for cell structure 1 of FIG. 2 indicated above, a modified vertical spin valve, is shown in FIG. 7 again in a representative monolithic integrated circuit implementation. The magnetoresistance of such a vertical spin valve stack can be 50% in theory. The magnetic layers (CoFe alloy) are thin (~20 Å) and are separated by very thin copper (~10 Å), and the total stack thickness is less than the spin flip length of spins. The magnetic layers within a multilayer stack are tightly parallel-coupled. One of the multilayers is pinned with an antiferromagnet with a low Nèel temperature, and the other is pinned with an antiferromagnet with a higher Nèel temperature. Storing data in the cell is achieved by heating the storage element to the lower Nèel temperature and cooling in a magnetic field supplied by the cladded word line conductor in a very similar fashion to the Curie point example. The energy storage depends on the interfacial coupling between the ferromagnetic layer in the multilayer stack and the antiferromagnet.

Figure 7:
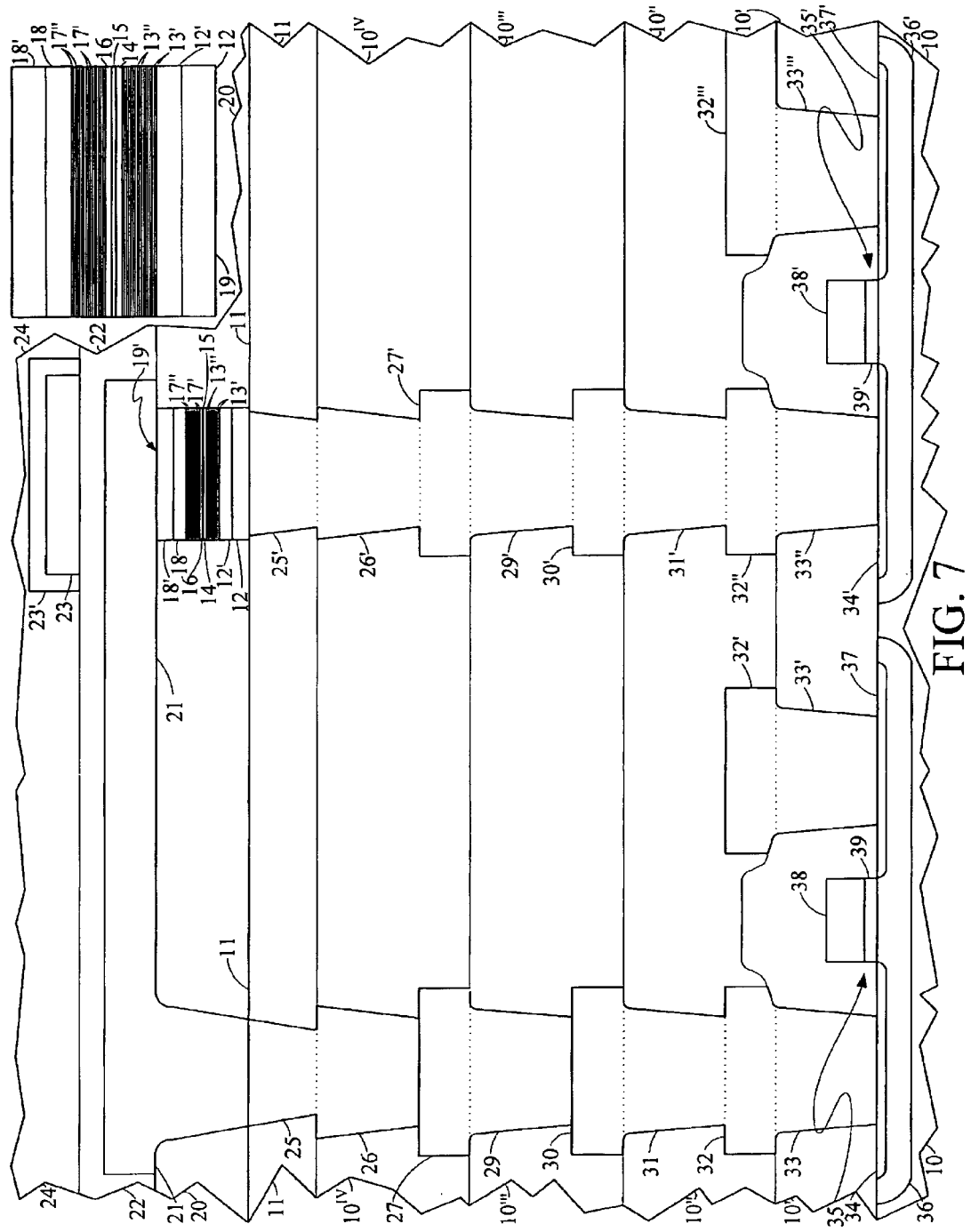
FIG. 7 shows a layer diagram of an alternative cell structure and interconnection arrangement in a monolithic integrated circuit cell control configuration.

One of the differences between this cell and the stacked tunnel junction cell of FIG. 6 is in the cell electrical resistance values. Getting enough resistance in this vertical spin valve cell so that I$^2$R power dissipation is high enough is difficult. The data storage current is still about 100 $\mu$A to keep cell size small, and analysis of the stacked tunnel junction showed that about 20 $\mu$W in power is required for a cell size of 0.5(0.1×0.1) $\mu$m$^2$, and that means a resistance of about 2000 $\Omega$ as set out above. The resistance-area product for the stacks shown in FIG. 7 are about 20 m$\Omega$–$\mu$m$^2$, and the device resistance would be about 4 $\Omega$. Raising the cell resistance to the required level is accomplished using a thin porous layer of copper added in the middle of the thick copper layer. This layer has to increase the resistance around 250 times. At 0.05 $\mu$m lithography, the resistance would have to increase only by 62.5, and the factor lessens with increasing density. A possible trade off would be to accept slower operating speeds for this design.

Turning to FIGS. 6 and 7 in more detail, they each show monolithic integrated circuit chip fragmentary view layer diagrams of the thermally switched memory cell magnetic structures for use with transistor current controllers, these structures being the double magnetic tunnel junction structure shown in FIG. 6 and the multilayer vertical spin valve structure shown in FIG. 7. These layer diagrams give indications of the structural layers leading to the cell structural portions shown in FIGS. 6 and 7, but they are not true cross section views in that many dimensions there are exaggerated or reduced relative to one another for purposes of clarity.

As can be seen in FIGS. 6 and 7, the memory cell structures are provided on a semiconductor material monolithic integrated circuit chip serving as a substrate therefor and having electronic circuit component devices provided in the semiconductor material, 10, thereof as the substrate for the remaining portions of the integrated circuit itself. Those remaining portions of the monolithic integrated circuit shown in FIGS. 6 and 7 above the semiconductor material 10 are a series of four electrical insulating layers, 10', 10", 10''', 10$^{iv}$, each typically formed of silicon dioxide. Each of the lower three of these electrical insulating layers have a metal circuit interconnection pattern supported thereon for electrically interconnecting selected ones of the circuit component devices therebelow in semiconductor material 10 and the integrated "sandwiches" tunneling or spin valve devices provided thereabove.

Following chemical and mechanical polishing of the surface of last or uppermost electrical insulating layer 10$^{iv}$, and the opening of vias therein to provide metal interconnections to the interconnection layer therebelow, a further electrical insulating layer, 11, is formed on the resulting surface by sputter deposition and silicon nitride to a thickness of typically 1000 Å. The surface of layer 11 is then also chemically and mechanically polished to provide a resulting surface on which the integrated "sandwiches" tunneling or spin valve devices are to be provided.

These integrated "sandwiches" tunneling devices in FIG. 6, or spin valve devices in FIG. 7, are next provided by a series of layer depositions with portions of these deposited layers being later removed by ion milling to leave the desired device portions remaining on the upper surface of layer 11 with the results therefor shown in the memory cell magnetic structures of FIGS. 6 and 7, and again in the corresponding insets in those figures which are enlarged for clarity. The remaining portions will be designated with the same numerical designation as are used in describing the deposition layers from which each is formed. Thus, a first thermal resistance control and magnetic "pinning" via layer, 12, is deposited on the exposed surface of an electrical interconnection extending through layer 11 from the integrated circuitry in the substrate below. Layer 12 can be formed of an alloy comprising CrPtMnB of 40% chromium, 10% platinum, 40% manganese and 10% boron is sputter deposited on the exposed interconnection and layer 11 to a thickness of 200 Å to 500 Å, depending on the thermal resistance desired, in the presence of a magnetization axis determination magnetic field along the planes of the figures. This is followed by continuing to sputter deposit around 200 Å of an alloy comprising PtMn of 50% platinum and 50% manganese as the remaining magnetic "pinning" via layer, 12', in forming a synthetic antiferromagnet.

The provision of the thermal resistance and magnetic pinning layers 12 and 12' is followed by providing a compound ferromagnetic thin-film and conductive thin-film layer combination together thereon layer. This compound thin-film layer is provided to have a net layer magnetization that, when fixed in a selected spatial orientation in the finally formed structure, will resist magnetization rotation, and certainly resist firmly any magnetization rotation therein that could be sufficient to lead to a reversal in its orientation as a result of expected externally applied magnetic fields. Thus, for the finally formed cell structures intended to be used in limited magnetic fields, the magnetization of this compound thin-film layer will appear fixed in its orientation in the device, i.e. "pinned" in a direction relative to the finally formed cell structure which will be in the planes of FIGS. 6 and 7.

This compound thin-layer film is formed by first sputter depositing a ferromagnetic material thin-film layer, 13', which is of CoFe comprising 95% cobalt and 5% iron to a thickness of 50 Å which layer is deposited in the presence of an easy axis direction determination magnetic field that is aligned with the plane of the figure. Then a nonmagnetic layer, 13", of ruthenium is sputter deposited to provide a Ru antiferromagnetic coupling layer of 9 Å thickness shown as a dark line in the main portions of FIGS. 1 and 2 but as an open rectangle in the corresponding insets. Thereafter, another ferromagnetic material layer, 13''', of CoFe comprising 95% cobalt and 5% iron is deposited to a thickness of 50 Å, and deposited again in the presence of an easy axis direction determination magnetic field aligned with the plane of the figures. The resulting compound layer 13', 13", 13''' has materials with high spin polarization in its outer layers due to the use of high magnetic induction CoFe therein, but has little total magnetic moment because of the Ru layer provided therebetween which strongly antiferromagnetically couples these outer layer through primarily exchange coupling so that the magnetizations of each are pointed in opposite directions. Thus, this layer is relatively insensitive to externally applied magnetic fields and contributes little to the spatial magnetic fields thereabout. However, the magnetization direction in this composite layer by itself is not very strongly fixed in any direction because of the relatively weak anisotropy exhibited by the CoFe layers, and so antiferromagnetic material "pinning" layers 12 and 12', exhibiting a substantial magnetic anisotropy, must be present to strongly set the magnetization direction of compound layer 13', 13", 13''' in the direction of the easy axis in the plane of the figures. Such a layer has a strongly fixed magnetization direction which, through exchange coupling to layer 13', strongly fixes the direction of magnetization of that layer also, and so that of layer 13''' through Ru layer 13".

Thereafter, the memory cells magnetic structures differ in the devices of FIGS. 6 and 7 for the next sequences of layers therein before another similar synthetic antiferromagnet, having a second thermal resistance control and magnetic "pinning" via layer, is provided on the opposite end of each of these next sequences in the corresponding memory cell magnetic structure. The material constituents in this latter synthetic antiferromagnet for the cell of FIG. 7 are changed in proportions to thereby provide it with a lower Nèel temperature than the first synthetic antiferromagnet already described above, but which otherwise behaves similarly, whereas the two synthetic antiferromagnets in the cell of FIG. 6 are made in essentially the same form and manner.

In the memory cell magnetic structure of FIG. 6, a spin dependent tunneling layer or barrier layer, 14, as a first intermediate layer is provided by sputter deposition onto layer 13''', this barrier layer being a dielectric and represented as a solid line in the main portion of FIG. 6 but as a narrow open rectangle in the corresponding inset. Layer 14 is provided typically by sputter depositing 12 Å of aluminum onto layer 13''', and continuing to provide two further angstroms of this material using the aluminum sputtering target but also introducing oxygen into the sputtering chamber. The result is to convert the already deposited aluminum layer substantially into aluminum oxide which expands its thickness by a factor of about 1.3, and to add another two angstroms of aluminum oxide thereto giving a barrier layer thickness of approximately 17.5 Å with this resulting layer being formed primarily of aluminum oxide.

Then, a ferromagnetic material thin-film layer, 15, is deposited on the exposed surface of layer 14 as a magnetic "free layer" that can have its magnetization direction relatively easily altered by external applied magnetic fields. Layer 12 can be formed of an alloy comprising 80% nickel and 20% iron to thereby have a Curie temperature that relatively low in comparison with the ferromagnetic material layers and the antiferromagnetic material layers in the structure synthetic antiferromagnets.

A second intermediate layer again furnished as a spin dependent tunneling layer or barrier layer, 16, is provided by sputter deposition onto layer 15, this barrier layer again being a dielectric and represented as a solid line in the main portion of FIG. 6 but as a narrow open rectangle in the corresponding inset. Layer 16 is provided in the same form and manner as barrier layer 14. Similarly, a ferromagnetic material layer, 17', is next provided as was layer 13', a ruthenium layer, 17", is then provided as was layer 13", and a further ferromagnetic material layer, 17''', is next provided as was layer 13''' for forming the second antiferromagnet in the device. This is completed by providing a magnetic "pinning" via layer, 18, as was layer 12' and another, or second, thermal resistance control and magnetic "pinning" via layer, 18', provided as was layer 12.

In the alternative for forming the memory cell magnetic structure for the cell of FIG. 7, thermal resistance control and magnetic "pinning" via layers 12 and 18' and magnetic "pinning" via layers 12' and 18 of FIG. 6 are again shown formed as described above but the remaining portions of the synthetic antiferromagnets of FIG. 6 are not shown in FIG. 7 thus resulting in weaker "pinning" of the adjacent ferromagnetic layers. This is a matter of choice in either of these figures made in consonance with the expected magnitudes of the externally applied fields so that layers 13', 13", 13''', 17', 17" and 17''' could be eliminated in the magnetic structure of FIG. 6, and corresponding layers 12", 12''', 12$^{iv}$, 18', 18" and 18''' are not shown but could be added in the magnetic structure of FIG. 7.

Instead, the designator thirteen in the magnetic structure of FIG. 7, is used with an alternating layers sequence formed on the higher Nèel temperature antiferromagnet in this FIG. 7 device having 20 Å thick sputter deposited ferromagnetic material layers of CoFe, exemplified by layers 13', that are provided separated from one another by 10 Å thick sputter deposited layers of Cu, exemplified by layers 13", to thereby be tightly parallel coupled layers with a total thickness less than the spin flip length of electron spins. On the last of ferromagnetic material layers 13' is sputter deposited a thicker layer, 14, of Cu to a thickness of 30 Å on which is next provided an electrical resistance augmentation layer formed as a porous Cu layer, 15, 10 Å thick. This layer is formed by sputter codepositing or alternately sputter depositing Cu and another material, such as aluminum or immiscible silicon, therewith and oxidizing the result to leave only copper filaments as the conductors.

The remainder of the magnetic structure in FIG. 7 outside the antiferromagnets therein is repeated in reverse order from layer 15 upward in that figure from the structure portion described above below that layer. Thus, a Cu layer, 16, like layer 14 is provided on layer 15, and is followed by an alternating layers sequence having 20 Å thick sputter deposited ferromagnetic material layers of CoFe, exemplified by layers 17', that are provided separated from one another by 10 Å thick sputter deposited layers of Cu exemplified by layers 17". The lower Nèel temperature antiferromagnet formed by magnetic "pinning" via layer 18 provided in the form of layer 12' and the second thermal resistance control and magnetic "pinning" via layer 18" provided in the form of layer 12 is formed on the alternating layers sequence exemplified by layers 17' and 17".

Upon completion of this alternating layers sequence and the lower Nèel temperature antiferromagnet formed by magnetic "pinning" via layer 18 and thermal resistance control and magnetic "pinning" via layer 18' thereon shown in FIG. 7, and the second intermediate layer provided by spin dependent tunneling layer or barrier layer 16 and magnetic "pinning" via layer 18 and thermal resistance control and magnetic "pinning" via layer 18' in FIG. 6, a further layer is deposited on layer 18' to provide an etching termination layer, or stop, for subsequent etching steps. A milling mask layer is next sputter deposited on the etch stop layer to there be prepared for use as a milling mask by being suitably patterned using standard techniques. This last masking pattern is to result, after milling therethrough to remove the exposed ferromagnetic, antiferromagnetic and nonmagnetic layers therebelow in the structures in FIGS. 6 and 7 to serve as portions of the corresponding memory cell double spin dependent tunneling structure, 19, and the vertical spin valve structure, 19', respectively, of those figures. Thus, with respect to FIG. 7, the subsequent ion milling step removes the exposed portions of thermal resistance control and magnetic "pinning" via layer 18' and magnetic "pinning" via layer 18 forming the lower temperature antiferromagnet, the alternating layers sequence exemplified by layers 17' and 17", thicker Cu layer 16, resistance augmentation porous Cu layer 15, thicker Cu layer 14, the alternating layers sequence exemplified by layers 13" and 13' along with magnetic "pinning" via layer 12' and thermal resistance control and magnetic "pinning" via layer 12 to thereby form memory cell multilayer vertical spin valve structure 19' of that figure.

Alternatively but similarly, upon completion of the synthetic antiferromagnet formed by magnetic "pinning" via layer 18 and thermal resistance control and magnetic "pinning" via layer 18' on layers 17''', 17" and 17' shown in FIG. 6, all provided on the second intermediate layer provided by spin dependent tunneling layer or barrier layer 16, a further layer is deposited on layer 18' to provide an etching termination layer, or stop, for subsequent etching steps. A milling mask layer is next sputter deposited on the etch stop layer to there be prepared for use as a milling mask by being suitably patterned using standard techniques. The subsequent ion milling step removes the exposed portions of thermal resistance control and magnetic "pinning" via layer 18' and magnetic "pinning" via layer 18 along with the remaining layers 17''', 17" and 17' in the synthetic antiferromagnet, barrier layer 16, ferromagnetic "free" layer 15, barrier layer 14, and the synthetic antiferromagnet formed by layers 13''', 13" and 13' along with magnetic "pinning" via layer 12' and thermal resistance control and magnetic "pinning" via layer 12 to thereby form memory cell double spin dependent tunneling structure 19 of that figure.

Following the completion of memory cell structures 10 in FIGS. 6 and 7, a layer of silicon nitride is sputter deposited over those structures and the exposed portions of insulating layer 11 to a thickness of 1000 Å to form another insulating layer. Photoresist is provided over this insulating layer as an etching mask to provide via openings therethrough in a following etching step to form a completed insulating layer, 20, and then through silicon nitride layer 11 to reach appropriate metal interconnection risers extending through other insulating layers in the monolithic integrated circuit therebelow. Alternatively, insulating layer 20 could be formed of an even lower thermal conductivity electrically insulating material to further reduce heat flows from memory cell structures 19 and 19' therethrough. Such alternative insulating materials can be organic materials such as polyimide or B-staged bisbenzocyclobutene (BCB) which have thermal conductivities below those of commonly used electrical insulating materials in monolithic integrated circuits such as silicon dioxide or silicon nitride.

On insulating layer 20, so prepared, a further metal deposition is made again of aluminum, but here alloyed with 2% copper, to cover that layer and fill the via openings therein, and in silicon nitride layer 11. This metal layer is deposited to a thickness of 2000 Å typically and patterned in a standard manner to eliminate the unwanted metal layer portions. The structures that result from this elimination are shown in FIGS. 1 and 2 as a plurality of interconnections, 21, for interconnecting memory cell structures 19 and 19', respectively, to the electronic circuitry in the integrated circuit therebelow through mating with metal interconnection risers extending through insulating layers of that integrated circuit.

A further protective electrical insulating layer, 22, of 1000 Å of silicon nitride (or lower thermal conductivity material) is sputter deposited to cover and protect interconnections 21. Again, photoresist is provided over this insulating layer as an etching mask to provide via openings therethrough in a following etching step to form a completed insulating layer, and then through silicon nitride layer 11 to reach appropriate metal interconnection risers extending through other insulating layers in the monolithic integrated circuit therebelow.

On insulating layer 22, so prepared, a further metal deposition is made again of aluminum, but here alloyed with 2% copper, to cover that layer and fill the via openings therein, and in silicon nitride layer 11. This metal layer is deposited to a thickness of 2000 Å typically and patterned in a standard manner to eliminate the unwanted metal layer portions. The structures that result from this elimination are shown in FIGS. 6 and 7 as a plurality of interconnections, 23, for providing word lines adjacent to, and over, memory cell structures 19 and 19', respectively, also connected to the electronic circuitry in the integrated circuit therebelow through mating with metal interconnection risers extending through insulating layers of that integrated circuit. A further metal deposition of permalloy (80% Ni and 20% Fe) ferromagnetic material is then made over interconnections 23 and the exposed portions of insulating layer 22 to a thickness of 60 Å and again patterned in a standard manner to eliminate the unwanted metal layer portions so as to leave a ferromagnetic material cladding about interconnections 23 just in the immediate vicinity of structures 19 and 19' as magnetic field "keepers", 23', to more closely confine and enhance the magnetic fields there generated by electrical currents selectively established in interconnections 23. A further protective electrical insulating layer, 24, of silicon nitride (or lower thermal conductivity material) is sputter deposited to cover and protect interconnections 23 with claddings 23' thereon.

Interconnection 21 extending from memory cell 19 in FIG. 6 and memory cell 19' in FIG. 7, and through insulating layer 20, meets an electrical interconnection riser on the left in those figures by having a portion thereof, 25, extend through silicon nitride layer 11 to reach a plug, 26, of tungsten and be in electrical contact therewith at the upper end of that riser. Plug 26 in turn extends through integrated circuit insulating layer $10^{iv}$ to reach and be in electrical contact with a portion, 27, of the third metal layer of that integrated circuit. This third metal portion is formed of primarily aluminum. A further aluminum plug, 25', extends from the bottom of the memory cell structure 19 in FIG. 6 and memory cell 19' in FIG. 7 through silicon nitride layer 11 to be in contact with a further tungsten plug, 26', extending through electrical insulating layer $10^{iv}$ to be in contact with another third metal layer interconnection portion, 27'.

Third metal layer interconnection portion 27 in FIGS. 6 and 7 is in contact with a further tungsten plug, 29, extending through electrical insulating layer 10''' to reach a portion, 30, of the aluminum second metal layer in the integrated circuit. Second metal layer portion 30 is in contact with a further tungsten plug, 31, which extends through electrical insulating layer 10'' of the integrated circuit to a portion, 32, of the aluminum first metal layer of the integrated circuit.

Third metal layer interconnection portion 27' in FIGS. 6 and 7 is in contact with a further tungsten plug, 29', extending through electrical insulating layer 10''' to reach another portion, 30', of the aluminum second metal layer in the integrated circuit. Second metal layer portion 30' is in contact with a further tungsten plug, 31', which extends through electrical insulating layer 10'' of the integrated circuit to another portion, 32'', of the aluminum first metal layer of the integrated circuit.

First metal layer portion 32 is in contact with a final tungsten plug, 33, extending through electrical insulating layer 10' of the integrated circuit to reach semiconductor material 10 of that integrated circuit, specifically, to be electrically connected to one of the terminating regions, 34, of a metal-oxide-semiconductor field-effect transistor (MOSFET), 35. Terminating region 34 of transistor 35 is formed of an $n^+$-type conductivity material formed in a p-type conductivity material tub, 36, in n-type conductivity semiconductor material 10. Transistor 35 has a further $n^+$-type conductivity material terminating region, 37, formed in p-type conductivity material tub 36. In addition, transistor 35 has an $n^+$-type conductivity polysilicon gate, 38, between terminating regions 34 and 37 separated from tub 36 by a thin gate oxide, 39.

Terminating region 37 has a tungsten plug, 33', extending through electrical insulating layer 10' of the integrated circuit to reach another portion, 32', of the first metal layer of the integrated circuit. In a typical arrangement, first metal layer portion 32' extends to a pad suited for connection to a positive source of voltage, with third metal layer portion 28 connected to a ground reference voltage. In this situation, terminating region 37 serves as a drain for transistor 35 and terminating region 34 serves as a source for transistor 35. If the polarity of the voltage between first metal interconnection layer portion 32' and third metal layer interconnection portion 28 are reversed, terminating region 34 would then serve as the drain for transistor 35 and terminating region 37 would serve as the source. In either situation, memory cell structure 19 and memory cell 19' in FIGS. 6 and 7, respectively, will have current provided therethrough controlled by transistor 35, and perhaps by others not shown in this figure.

First metal layer portion 32'' is in contact with a final tungsten plug, 33'', extending through electrical insulating layer 10' of the integrated circuit to reach semiconductor material 10 of that integrated circuit, specifically, to be electrically connected to one of the terminating regions, 34', of another MOSFET, 35'. Terminating region 34' of transistor 35' is formed of an $n^+$-type conductivity material formed in a p-type conductivity material tub, 36', in n-type conductivity semiconductor material 10. Transistor 35' has a further $n^+$-type conductivity material terminating region, 37', formed in p-type conductivity material tub 36'. In addition, transistor 35' has an $n^+$-type conductivity polysilicon gate, 38', between terminating regions 34' and 37' separated from tub 36' by a thin gate oxide, 39'.

Terminating region 37' has a tungsten plug, 33''', extending through electrical insulating layer 10' of the integrated circuit to reach another portion, 32''', of the first metal layer of the integrated circuit. In a typical arrangement, first metal layer portion 32''' extends to a pad suited for connection to a positive source of voltage. In this situation, terminating region 37' serves as a drain for transistor 35' and terminating region 34' serves as a source for transistor 35'.

The thermal switching analysis of the type of cell shown in FIG. 6 that follows assumes single domain behavior in view of the very small sizes of the cell free layer. For cells with shape anisotropy, there are two magnetic states in either of which the cell free layer magnetization could occur, but an externally applied magnetic field Ha makes far more likely the cell being written in the desired state that is in effect selected by the field direction rather than in the undesired state.

The energy well needed to insure that a cell is sufficiently stable against thermal upset to ensure the reliability of a memory is known to be about 55 kT. As such a cell cools, the energy well develops to 55 kT, which is the sum of the energy well contribution well due to both cell anisotropy and to the externally applied field. To ensure that the undesired state is not written, the energy well for that state should concurrently be zero which the applied field in effect must cancel. Thus, energy well depth due to the applied field and the well depth due to anisotropy should both equal 27.5 kT. There will be perhaps 1 billion times as many cells not being written as being written on the memory cell chip each contributing to the risk of a cell thermal upset, and these cells must be stable as well. Therefore, as the cell cools to a nominal ambient temperature, the well depth must grow by approximately 20.7 kT (the natural logarithm of 1 billion) to offset the risk contribution of all of these other cells plus 55 kT without the contribution of the applied field. Thus, the well depth due to anisotropy must grow from 27.5 kT at the writing point to 75.7 kT, a factor of about 2.75, at the nominal ambient temperature with no applied field. This may be accomplished because of the rapid change in magnetization with temperature in the range 100° C. less than the Curie point.

The switching model predicts that the required digit current for switching increases as the square root of the reciprocal of line width w according to the following equation:

$$Ha = [13.75 \text{ kT}/\mu_0 w^3]^{1/2}.$$

The currents needed to switch a 0.4 μm wide cell are calculated to be 0.5 mA for the digit current using a cladded drive line, depending to some extent on the effectiveness of the cladding. These currents are much smaller than switching currents for other comparable size magnetoresistive memory cells. A cell having a width of 0.1 μm requires a current in a cladded line that would still be 2 mA. For a cell width of 0.05 μm, the digit current required would be about 3 mA. In these cases the heating currents should be about 100 μA.

Selection of the material for the intermediate leads is an important consideration. As was mentioned earlier, the lead length L must be long enough to give the needed thermal rise (200° C. for example) and short enough to give a fast thermal response (5 ns for example). These two requirements may be stated in inequality form from the corresponding equations given above as:

$$PL/2KA > 200,$$

and $$\tau = L^2/2D < 5 \cdot 10^{-9}.$$

Both these inequalities are satisfied when $$D^{1/2}/K = 5 \text{ cm}^2 \text{-° C.}/Ws^{1/2}.$$

PtMn comes close with a thermal conductivity of 0.03 watt–cm/° C. and a thermal diffusivity of about 0.009 cm²/s. The electrical resistivity is about 160 μΩ–cm. The thermal conductivity of a material is due to two major components, one due to conduction electrons and the other due to phonons. Polycrystalline materials have a lower thermal conductivity than their single crystal form. Adding another substance, such as boron, to PtMn, the thermal conductivity will get smaller. Likewise, the electrical conductivity will be less.

PtMn is a commonly used antiferromagnet for pinning in magnetic tunnel junctions. Sometimes Cr is added to reduce cost, and the pinning properties are about the same. Boron added to CrPtMn behaves about the same as PtMn with added boron. If the thermal conductivity decreases by a factor of 3 with boron added, and if the electrical conductivity decreases by a factor of 6, the parameters needed for speed and power will be met. With a 800 μΩ–cm resistivity, a $10^{-5}$ cm path length, and a $0.5(0.01-10^{-8})$ cm² area, the lead resistance is about 160 Ω. This is acceptable since the resistance of the stacked junction is about 4000 W.

Most of the preceding analysis also applies to the alternative cell structure shown in FIG. 7 in which one of the multilayers is pinned with an antiferromagnet having a low Nèel temperature, and the other is pinned with an antiferromagnet having a higher Nèel temperature. This allows storing data in the cell by heating the storage element to the lower Nèel temperature and thereafter cooling the cell in a magnetic field supplied by current in interconnection 23 in a manner similar to the FIG. 6 device.

Alternatively, memory cell structures 19 and 19', rather than having a separate current supply line like supply line 4 in FIG. 2 and interconnection 21 in FIGS. 6 and 7, can be configured so that word lines 23 also carries the cell state sense current and the thermally assisted cell state setting current through their being in direct contact with those cell structures. In such a configuration, the cell structure will be heated by passing electrical current through the word line conductor and through the selection transistor connected thereto. Then, before the cell structure cools, a transistor at the end of the word line conductor is switched on, and current is passed through the word line for the purpose of storing data by setting a cell magnetization state as the cell structure cools. The selection transistor insures that only one cell in the array is heated so that only that cell under the word line conductor has data stored therein. This further allows for the word line cladding 23' at each cell structure to be extended downward to be about corresponding sides of the associated cell structure to thereby reduce fringing in the magnetic fields generated by electrical currents established in the adjacent word line, and so reduce the electrical current in word line 23 needed to achieve a magnetic field therefrom of a selected intensity. Furthermore, the combining of the word lines with those carrying the sensing and thermal generation electrical currents allows an increase in the areal cell density across the monolithic integrated circuit chip.

Figure 8:
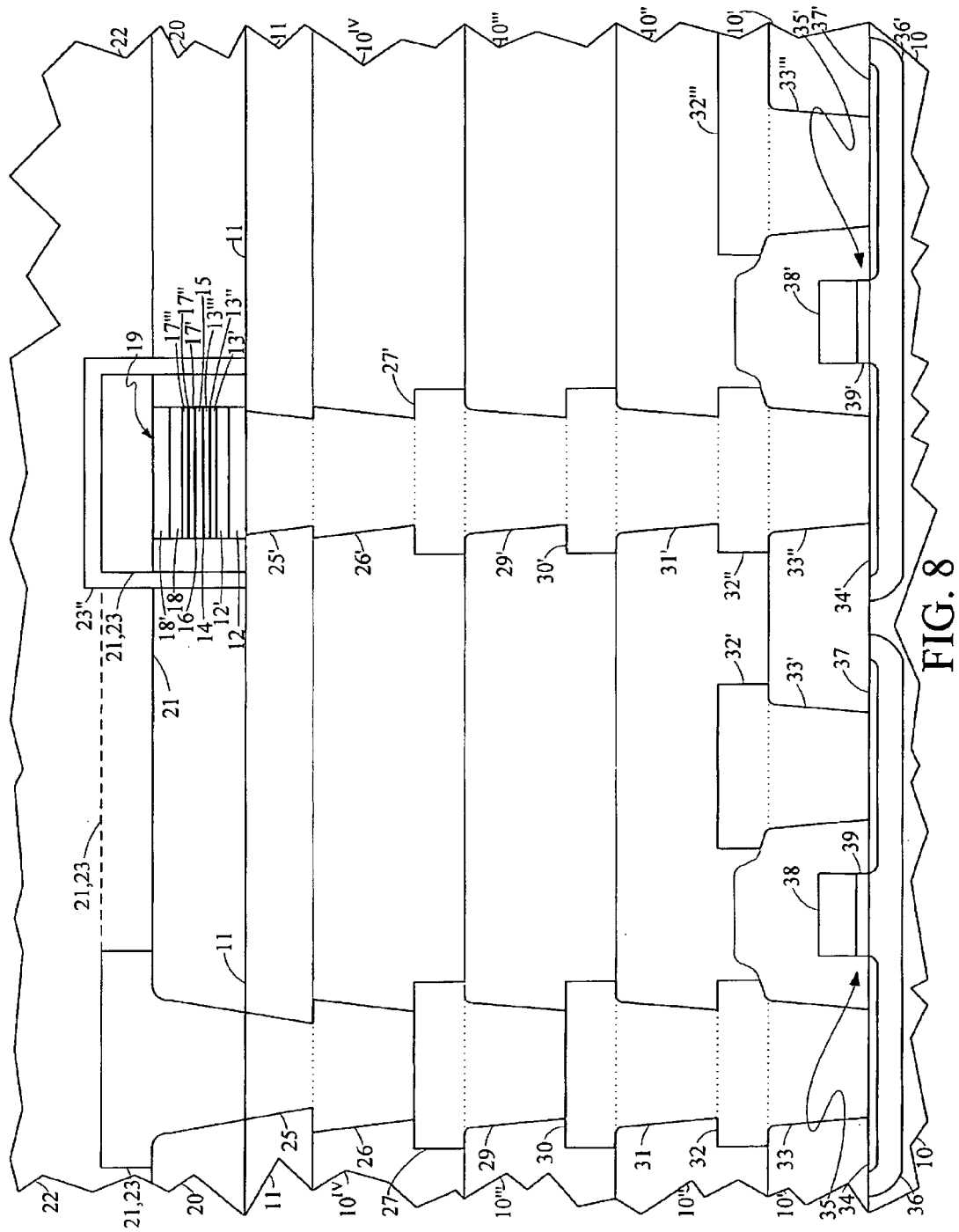
FIG. 8 shows a layer diagram of a cell structure and interconnection arrangement in a monolithic integrated circuit cell control configuration.
Figure 9:
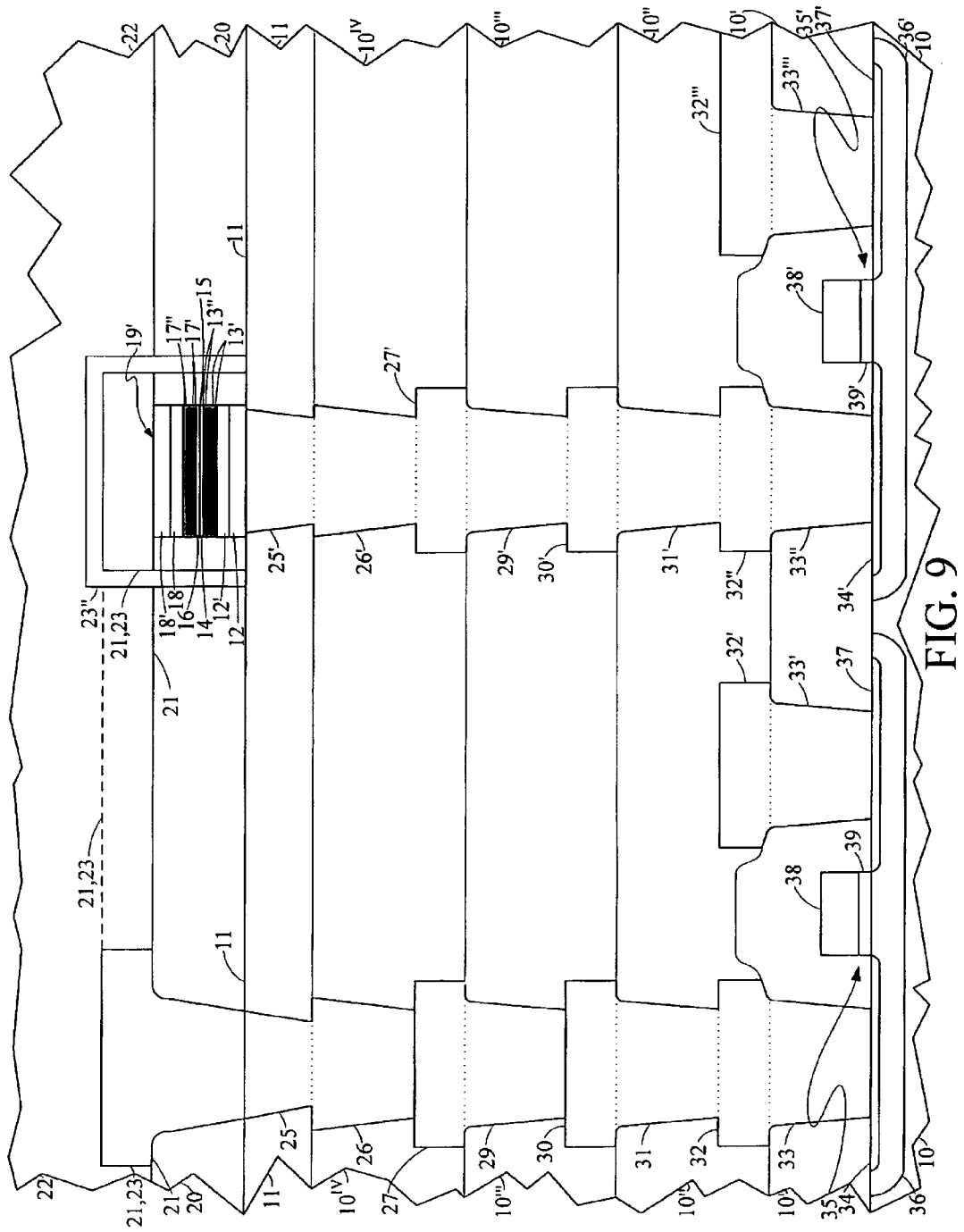
FIG. 9 shows a layer diagram of a cell structure and interconnection arrangement in a monolithic integrated circuit cell control configuration.

Thus, in FIGS. 8 and 9, the word line at the cell combined with the interconnection to the top of the cell, 21,23, is shown in solid line form where in electrical and physical contact with the cell with an extension thereof rearward and then to the right being shown in dashed line form. Downward extended cladding, 23", is seen to provide a much more closely defined magnetic path about the memory cell structure. Insulating layer 24 in FIGS. 6 and 7 is no longer needed to protect cladded word lines 23 in FIGS. 8 and 9 which is accomplished with insulating layer 22 alone, and so is not shown in these latter figures.

If the cladding material is an electrical insulator and a poor thermal conductor, then no insulating spacing between the cladding and the cell would be needed. In the more usual situation in which the cladding material is either a good electrical or thermal conducting ferromagnetic material, or both, an insulating spacing layer would be required. The fabrication process can be accomplished in a similar manner to the spacer dot process used in integrated circuit production. First form the cell structure layers stack with the thermal vias. Then coat the stack with an insulator, polish the insulator back to allow electrical and physical contact to the stack, and form the word line with cladding on top. The word line must be oversized with respect to the cell structure to allow for insulation from the cladded edge of the word line to the edge of the stack. Then etch down vertically using the word line as a mask. The cladding on top may have to be thick to allow for etching of the cladding at this step. Then deposit cladding material uniformly on the substrate. Then etch down vertically to remove the newly deposited cladding material except near the edges of the stack.

Although the present invention has been described with reference to preferred embodiments, workers skilled in the art will recognize that changes may be made in form and detail without departing from the spirit and scope of the invention.

What is claimed is:

1. A ferromagnetic thin-film based digital memory, said memory comprising:

a substrate;

a plurality of bit structures, each supported on said substrate and separated from one another by spacer material therebetween, that are electrically interconnected with information storage and retrieval circuitry, said bit structures each comprising a first magnetic material film in which a characteristic magnetic property is substantially maintained below a first critical temperature above which such magnetic property is not maintained and a second magnetic material film in which a characteristic magnetic property is substantially maintained below a second critical temperature above which such magnetic property is not maintained, and with said second magnetic material film being separated from said first magnetic material film by at least one intermediate layer of a nonmagnetic material having two major surfaces on opposite sides thereof, said bit structures each having a first interconnection structure providing electrical contact thereto positioned against a first contact surface thereof substantially parallel to said intermediate layer major surfaces and also between said first contact surface and said substrate; and a plurality of word line structures each having a pair of word line end terminal regions adapted to conduct electrical current in at least one direction therethrough, each of said pairs of word line end terminal regions having an electrical conductor electrically connected therebetween which is located on an opposite side of said intermediate layer of a corresponding one of said bit structures from said first interconnection structure providing electrical contact thereto, said information storage and retrieval circuitry for drawing a sufficient electrical current selectively through each said bit structure and said first interconnection structure providing electrical contact thereto to cause substantial heating of that said bit structure to raise temperatures thereof to have at least one of said first and second magnetic material films therein at least approach its corresponding one of said first and second critical temperatures while being substantially above temperatures of at least an adjacent said bit structure because of sufficient extent of, and smallness of thermal conductivities of, at least portions of said selected bit structure and of those portions of said substrate and said spacer material positioned thereabout.

2. The device of claim 1 wherein said plurality of word line structures each has said electrical conductor therein located across said spacer material from said corresponding one of said bit structures, and wherein each of said bit structures has a second interconnection structure providing electrical contact thereto positioned against a second contact surface thereof substantially parallel to said intermediate layer major surfaces located on an opposite side of said intermediate layer therein from said first interconnection structure also providing electrical contact thereto.

3. The device of claim 2 further comprising said plurality of bit structures each having a relatively high thermal resistance material layer located between said intermediate layer and said first interconnection structure which has a thermal diffusivity less than that of said first interconnection structure, and another relatively high thermal resistance material layer located between said intermediate layer and said second interconnection structure which has a thermal diffusivity less than that of said second interconnection structure.

4. The device of claim 3 wherein said intermediate layer is formed from an electrically insulative material.

5. The device of claim 4 wherein said intermediate layer is a first intermediate layer and further comprising a second intermediate layer of an electrically insulative material which is separated from said first intermediate layer by a separating magnetic material layer, said first and second intermediate layers each having an antiferromagnet on a side thereof opposite that closest to said separating magnetic material layer.

6. The device of claim 3 wherein said intermediate layer is formed from an electrically conductive material.

7. The device of claim 6 wherein said intermediate layer contains a porous metal layer portion, and has on each side thereof an antiferromagnet which loses its antiferromagnetic behavior at elevated temperatures differing from one another.

8. The device of claim 1 wherein said plurality of word line structures each has said electrical conductor therein providing electrical contact to said corresponding one of said bit structures through being against a second contact surface thereof substantially parallel to said intermediate layer major surfaces located on an opposite side of said intermediate layer therein from said first interconnection structure also providing electrical contact thereto.

9. The device of claim 8 further comprising said plurality of bit structures each having a relatively high thermal resistance material layer located between said intermediate layer and said first interconnection structure which has a thermal diffusivity less than that of said first interconnection structure, and another relatively high thermal resistance material layer located between said intermediate layer and said corresponding word line electrical conductor providing electrical contact thereto which has a thermal diffusivity less than that of that said corresponding word line electrical conductor.

10. The device of claim 9 wherein said intermediate layer is formed from an electrically insulative material.

11. The device of claim 10 wherein said intermediate layer is a first intermediate layer and further comprising a second intermediate layer of an electrically insulative material which is separated from said first intermediate layer by a separating magnetic material layer, said first and second intermediate layers each having an antiferromagnet on a side thereof opposite that closest to said separating magnetic material layer.

12. The device of claim 9 wherein said intermediate layer is formed from an electrically conductive material.

13. The device of claim 12 wherein said intermediate layer contains a porous metal layer portion, and has on each side thereof an antiferromagnet which loses its antiferromagnetic behavior at elevated temperatures differing from one another.

14. The device of claim 8 further comprising said plurality of word line structures each having said electrical conductor therein providing electrical contact to said corresponding one of said bit structures has at least one side thereof cladded with a magnetically permeable material.

15. The device of claim 14 further comprising said magnetically permeable material extending from where cladding a said electrical conductor corresponding to one of said bit structures to being positioned across from opposite edges of said intermediate layer in that said bit structure.

16. The device of claim 1 further comprising said plurality of bit structures each having a relatively high thermal resistance material layer located between said intermediate layer and said first interconnection structure which has a thermal diffusivity less than that of said first interconnection structure.

17. The device of claim 16 wherein said relatively high thermal resistance material layer also is antiferromagnetic.

18. The device of claim 1 wherein said intermediate layer is formed from an electrically insulative material.

19. The device of claim 18 wherein said intermediate layer is a first intermediate layer and further comprising a second intermediate layer of an electrically insulative material which is separated from said first intermediate layer by a separating magnetic material layer, said first and second intermediate layers each having an antiferromagnet on a side thereof opposite that closest to said separating magnetic material layer.

20. The device of claim 1 wherein said intermediate layer is formed from an electrically conductive material.

21. The device of claim 20 wherein said intermediate layer contains a porous metal layer portion, and has on each side thereof an antiferromagnet which loses its antiferromagnetic behavior at elevated temperatures differing from one another.

22. The device of claim 1 wherein said information storage and retrieval circuitry has a plurality of transistors therein so that each of said plurality of bit structures has a said transistor electrically coupled thereto that selectively substantially prevents current in at least one direction along a current path through that said bit structure.

* * * * *

UNITED STATES PATENT AND TRADEMARK OFFICE
CERTIFICATE OF CORRECTION

PATENT NO. : 6,963,098 B2  Page 1 of 1
APPLICATION NO. : 10/875,082
DATED : November 8, 2005
INVENTOR(S) : James M. Daughton et al.

It is certified that error appears in the above-identified patent and that said Letters Patent is hereby corrected as shown below:

Column 21, Line 60, after "to", insert --thereby--

Signed and Sealed this

Twelfth Day of December, 2006

JON W. DUDAS
*Director of the United States Patent and Trademark Office*

UNITED STATES PATENT AND TRADEMARK OFFICE
CERTIFICATE OF CORRECTION

PATENT NO. : 6,963,098 B2 Page 1 of 1
APPLICATION NO. : 10/875082
DATED : November 8, 2005
INVENTOR(S) : James M. Daughton et al.

It is certified that error appears in the above-identified patent and that said Letters Patent is hereby corrected as shown below:

Column 21, Line 60, after "to", insert --thereby--

Signed and Sealed this

Second Day of January, 2007

JON W. DUDAS
*Director of the United States Patent and Trademark Office*

UNITED STATES PATENT AND TRADEMARK OFFICE
CERTIFICATE OF CORRECTION

PATENT NO. : 6,963,098 B2  
APPLICATION NO. : 10/875082  
DATED : November 8, 2005  
INVENTOR(S) : James M. Daughton et al.

It is certified that error appears in the above-identified patent and that said Letters Patent is hereby corrected as shown below:

Column 1, Line 12, insert the following paragraph between Cross-Reference To Related Application paragraph and Background of the Invention:

--This invention was made with Government support under HDTRA1-04-C-0002 awarded by the Defense Threat Reduction Agency. The Government has certain rights in the invention.--

Signed and Sealed this

First Day of July, 2008

JON W. DUDAS  
*Director of the United States Patent and Trademark Office*